United States Patent
Ashizawa

(10) Patent No.: US 8,623,457 B2
(45) Date of Patent: Jan. 7, 2014

(54) VACUUM PROCESSING SYSTEM

(75) Inventor: Kengo Ashizawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 707 days.

(21) Appl. No.: 12/816,750

(22) Filed: Jun. 16, 2010

(65) Prior Publication Data

US 2010/0256809 A1   Oct. 7, 2010

Related U.S. Application Data

(63) Continuation of application No. 11/563,588, filed on Nov. 27, 2006, now abandoned.

(60) Provisional application No. 60/754,630, filed on Dec. 30, 2005.

(30) Foreign Application Priority Data

Nov. 28, 2005   (JP) ................................ 2005-342082

(51) Int. Cl.
*C23C 16/00* (2006.01)
*B05C 5/00* (2006.01)

(52) U.S. Cl.
USPC . 427/255.28; 118/683; 118/719; 156/345.32; 216/58; 700/228

(58) Field of Classification Search
None
See application file for complete search history.

(56) References Cited

U.S. PATENT DOCUMENTS

| | | | |
|---|---|---|---|
| 5,433,780 | A | 7/1995 | Ikeda et al. |
| 5,611,655 | A | 3/1997 | Fukasawa et al. |
| 5,855,679 | A | 1/1999 | Ogawa |
| 2003/0219977 | A1 | 11/2003 | Pomarede et al. |

FOREIGN PATENT DOCUMENTS

| | | |
|---|---|---|
| JP | 03-087386 | 4/1991 |
| JP | 6-216075 | 8/1994 |
| JP | 7-29962 | 1/1995 |
| JP | 7-211761 | 8/1995 |
| JP | 8-148539 | 6/1996 |
| JP | 10-247677 | 9/1998 |
| JP | 2003-224173 | 8/2003 |
| JP | 2004-71723 | 3/2004 |
| JP | 2005-116854 | 4/2005 |

OTHER PUBLICATIONS

Japanese Office Action issued Aug. 10, 2010, in Patent Application No. 2005-342082 (with English-language translation).

*Primary Examiner* — Parviz Hassanzadeh
*Assistant Examiner* — Nathan K Ford
(74) *Attorney, Agent, or Firm* — Oblon, Spivak, McClelland, Maier & Neustadt, L.L.P.

(57) ABSTRACT

A vacuum processing system includes a transfer chamber configured to form a vacuum atmosphere through which a target object is transferred. A transfer mechanism is disposed in the transfer chamber and configured to transfer the target object. A process chamber is connected to the transfer chamber through a first gate valve and configured to perform a process on the target object within a vacuum atmosphere. A first exhaust port is formed in a bottom of the transfer chamber at the foot of the first gate valve. A first gas exhaust section is connected to the first exhaust port and configured to exhaust gas inside the transfer chamber.

20 Claims, 6 Drawing Sheets

VACUUM PROCESSING SYSTEM

CROSS-REFERENCE TO RELATED APPLICATIONS

This application is a Continuation of U.S. application Ser. No. 11/563,588, filed Nov. 27, 2006, the entire content of which is incorporated herein by reference. U.S. application Ser. No. 11/563,588 claims the benefit of U.S. Provisional Application No. 60/754,630, filed Dec. 30, 2005. U.S. application Ser. No. 11/563,588 is based upon and claims the benefit of priority from prior Japanese Patent Application No. 2005-342082, filed Nov. 28, 2005, the entire content of which is incorporated herein by reference.

BACKGROUND OF THE INVENTION

1. Field of the Invention

The present invention relates to a vacuum processing system for processing a target object within a vacuum atmosphere, and particularly to an improvement of a semiconductor processing technique. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In manufacturing semiconductor devices and FPDs, various processes, such as film formation processes, thermal processes, dry etching processes, cleaning processes, are performed using process gases within vacuum process chambers. A process chamber for performing a vacuum process of this type is connected through a gate valve to a transfer chamber provided with a transfer robot disposed therein (for example, Jpn. Pat. Appln. KOKAI Publication No. 3-87386). The transfer robot is used for transferring a target object (such as a semiconductor wafer or glass substrate) between the transfer chamber and process chamber. At this time, this transfer is performed without setting the process chamber opened to the atmosphere. According to a transfer chamber of a first type, the interior of the chamber is always maintained in a vacuum state. According to a transfer chamber of a second type, the chamber is configured to adjust the inner pressure between atmospheric pressure and a vacuum.

Where a transfer chamber of the first type is used, the transfer chamber is connected through a gate valve to a load-lock chamber capable of adjusting the inner pressure between atmospheric pressure and a vacuum. The load-lock chamber is connected to an atmospheric pressure space through a door valve disposed on a side opposite to the gate valve. The load-lock chamber is used for temporarily placing a target object transferred between the atmospheric pressure space and vacuum space. Where a transfer chamber of the second type is used, the transfer chamber itself is structured as a load-lock chamber capable of adjusting the inner pressure between atmospheric pressure and a vacuum. The transfer chamber of the second type is connected to an atmospheric pressure space through a door valve disposed on a side opposite to the gate valve.

The gate valve is a switching valve vertically partitioning a passage for a target object. The gate valve is normally set in the closed state, and is temporarily set in an opened state to allow a target object or an arm of a transfer robot to pass therethrough. When the gate valve disposed between a vacuum process chamber and a transfer chamber is opened, a target object can be transferred between the process chamber and transfer chamber.

BRIEF SUMMARY OF THE INVENTION

An object of the present invention is to provide a vacuum processing system that can reliably prevent the process atmosphere inside a vacuum process chamber from diffusing into a transfer chamber, when the gate valve disposed therebetween is opened to transfer a target object to and from the vacuum process chamber.

According to a first aspect of the present invention, there is provided a vacuum processing system comprising:

a transfer chamber configured to form a vacuum atmosphere through which a target object is transferred;

a transfer mechanism disposed in the transfer chamber and configured to transfer the target object;

a process chamber connected to the transfer chamber through a first gate valve and configured to perform a process on the target object within a vacuum atmosphere;

a first exhaust port formed in a bottom of the transfer chamber at the foot of the first gate valve; and a first gas exhaust section connected to the first exhaust port and configured to exhaust gas inside the transfer chamber.

The system according to the first aspect may further comprise: a second exhaust port formed in the bottom of the transfer chamber at a position closer to a center of the transfer chamber than the first exhaust port is; and a second gas exhaust section connected to the second exhaust port and configured to exhaust gas inside the transfer chamber.

The transfer chamber may be structured as a common transfer chamber of a system of the cluster tool type. In this case, the system may further comprise a load-lock chamber connected to the transfer chamber through a second gate valve, and capable of adjusting an inner pressure thereof between atmospheric pressure and a vacuum.

The transfer chamber may be structured as a load-lock chamber capable of adjusting an inner pressure thereof between atmospheric pressure and a vacuum. In this case, the transfer chamber may be connected to an atmospheric pressure space through a door valve.

According to a second aspect of the present invention, there is provided a vacuum processing system comprising:

a common transfer chamber configured to form a vacuum atmosphere through which a target object is transferred;

a transfer mechanism disposed in the common transfer chamber and configured to transfer the target object;

a plurality of process chambers connected to the common transfer chamber respectively through first gate valves and each configured to perform a process on the target object within a vacuum atmosphere;

a plurality of individual exhaust ports formed in a bottom of the common transfer chamber at the foot of the first gate valves, respectively corresponding to the process chambers; and a plurality of individual gas exhaust sections respectively connected to the individual exhaust ports and each configured to exhaust gas inside the common transfer chamber.

The system according to the second aspect may further comprise: a common exhaust port formed in the bottom of the common transfer chamber at a position closer to a center of the common transfer chamber than the individual exhaust ports are; and a common gas exhaust section connected to the common exhaust port and configured to exhaust gas inside the common transfer chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
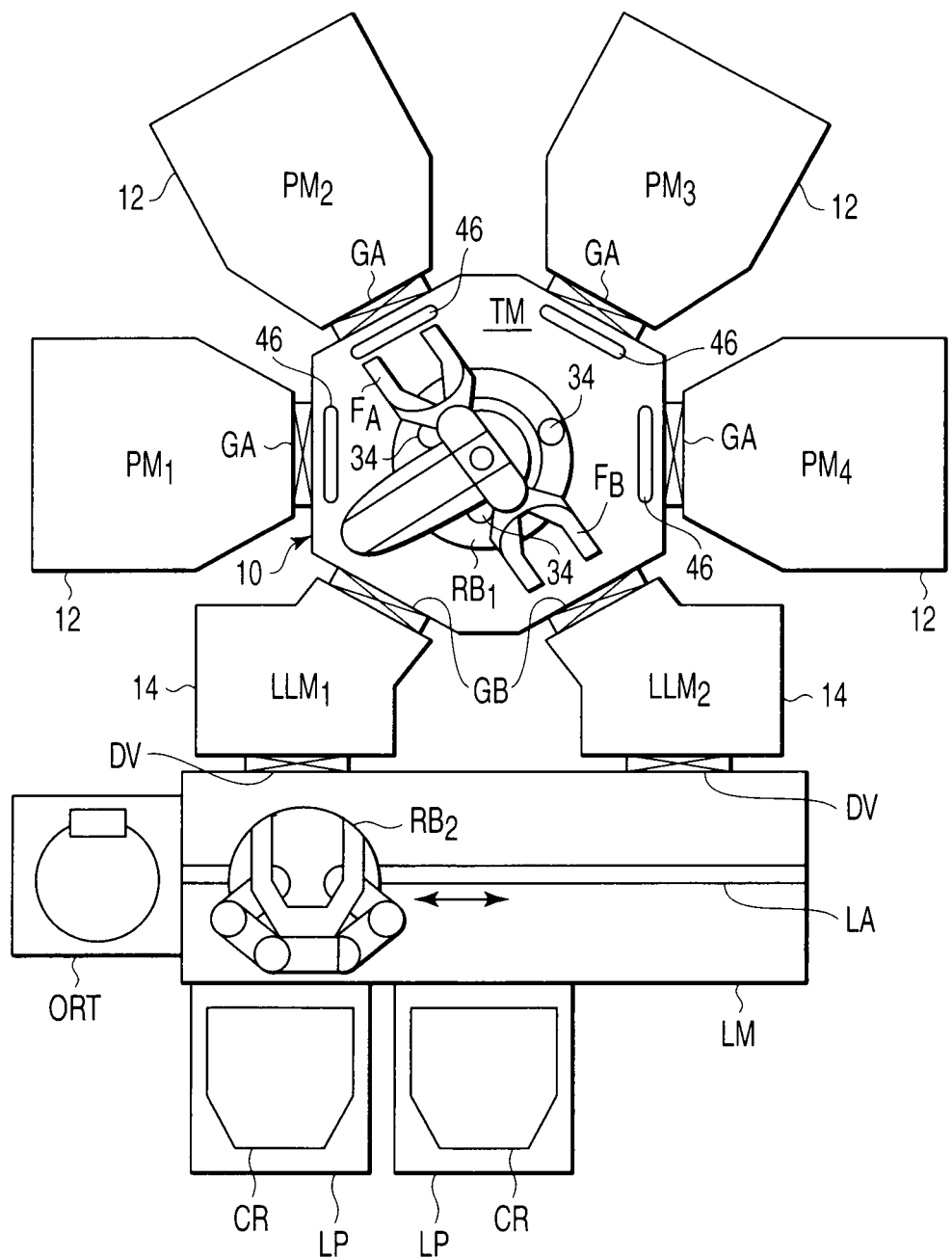
FIG. 1 is a sectional plan view schematically showing the entire structure of a vacuum processing system according to a first embodiment of the present invention.

In the process of developing the present invention, the inventors studied problems caused in conventional vacuum processing systems, such as corrosion, contamination, and particle generation within a transfer chamber. As a result, the inventors have arrived at the findings given below.

When the gate valve disposed between a vacuum process chamber and a transfer chamber is opened, the process atmosphere inside the process chamber may diffuse into the transfer chamber and spread therein. In this case, the process atmosphere contains a remaining gas and/or a reaction by-product, which are corrosive and thus cause problems, such as corrosion, contamination, and particle generation, inside the transfer chamber. Accordingly, it is necessary to prevent the gas inside the vacuum process chamber from flowing into the transfer chamber, when the gate valve is opened. For this purpose, there is a pressure control method in which the pressure inside a transfer chamber is set to be higher than that inside the vacuum process chamber. In this respect, since the gas inside the transfer chamber is inactive, even if the gas flows into the vacuum process chamber, it will not cause problems, such as corrosion.

Further, according to conventional vacuum processing systems, an exhaust port is formed at the central portion of a transfer chamber, i.e., near the main body of a transfer robot, and is connected to a vacuum pump for vacuum-exhausting the chamber. This arrangement is adopted to uniformly gather and efficiently exhaust the gas inside the transfer chamber by the vacuum pump through the exhaust port at the central portion. In order to prevent the gas inside the vacuum process chamber from flowing into the transfer chamber, it may be arranged such that the vacuum pump is stopped when the gate valve is opened, while the transfer chamber is set to have a positive inner pressure relative to the process chamber. However, even with this arrangement, it is difficult to sufficiently prevent the gas inside the vacuum process chamber from diffusing into the transfer chamber against the pressure gradient (i.e., backward diffusion), when the gate valve is opened. Consequently, problems arise, such as corrosion, contamination, and particle generation, inside the transfer chamber.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a sectional plan view schematically showing the entire structure of a vacuum processing system according to a first embodiment of the present invention. The vacuum processing system according to the first embodiment is of the so-called cluster tool type, which is set up inside a clean room. The system includes a transfer module TM having a vacuum transfer chamber 10 with a hexagonal shape. Around the transfer module TM, a plurality of (for example, four) process modules $PM_1$, $PM_2$, $PM_3$, and $PM_4$ and a pair of load-lock modules $LLM_1$ and $LLM_2$ are disposed in a cluster format.

Each of the process modules $PM_1$, $PM_2$, $PM_3$, and $PM_4$ has a vacuum process chamber 12 capable of setting or controlling the inner pressure independently of the others. Each of the load-lock modules $LLM_1$ and $LLM_2$ has a load-lock chamber 14 capable of adjusting the inner pressure between atmospheric pressure and a vacuum, as described later. The process chamber 12 of each of the process modules $PM_1$, $PM_2$, $PM_3$, and $PM_4$ is connected to the transfer chamber 10 of the transfer module TM through a gate valve GA. The load-lock chamber 14 of each of the load-lock modules $LLM_1$ and $LLM_2$ is connected to the transfer chamber 10 of the transfer module TM through a gate valve GB. The transfer chamber 10 is provided with a vacuum transfer robot $RB_1$ disposed therein, which has a pair of transfer arms $F_A$ and $F_B$ configured to be rotatable and extensible/contractible.

Each of the process modules $PM_1$, $PM_2$, $PM_3$, and $PM_4$ is arranged to perform a predetermined single-wafer process within the process chamber 12 while using predetermined utilities (such as process gas, RF (Radio Frequency) power, and heat). Examples of the process are film formation processes, such as CVD (Chemical Vapor Deposition), ALD (Atomic Layer Deposition), and PVD (Physical Vapor Deposition), thermal processes, cleaning processes of the surface of a semiconductor wafer, and dry etching processes.

Each of the load-lock modules $LLM_1$ and $LLM_2$ is arranged to switch the atmosphere inside the corresponding load-lock chamber 14 between an atmospheric pressure state and a vacuum state of a predetermined vacuum level. The load-lock chamber 14 is connected through a door valve DV to an atmospheric transfer chamber of a loader module LM disposed on a side opposite to the transfer module TM. The interior of the atmospheric transfer chamber is set to be at atmospheric pressure.

Load port devices LP and an orientation-flat alignment mechanism ORT are disposed adjacent to the loader module LM. Each of the load port devices LP is arranged to input and output a wafer cassette CR from and to an external transfer vehicle. The wafer cassette CR is capable of storing one batch of semiconductor wafers W (for example, 25 wafers). The orientation-flat alignment mechanism ORT is used to align the orientation flat or notch of a semiconductor wafer W in a predetermined position or direction.

The loader module LM is provided with an atmospheric transfer robot $RB_2$ disposed therein, which has a pair of transfer arms configured to be extensible/contractible. The atmospheric transfer robot $RB_2$ is movable in a horizontal direction along a linear guide (linear slide) LA, and is further movable up and down and is rotatable. The atmospheric transfer robot $RB_2$ is arranged to transfer semiconductor wafers W one by one, while moving back and forth among the load port devices LP, orientation-flat alignment mechanism ORT, and load-lock modules $LLM_1$ and $LLM_2$.

When the LP door (not shown) disposed on the front side of the wafer cassette CR is in an opened state, the atmospheric transfer robot $RB_2$ can transfer a semiconductor wafer W between the loader module LM and the wafer cassette CR. For example, the linear guide LA comprises a magnet, such as a permanent magnet, a driving magnetic coil, and a scale head. The linear guide LA is arranged to control the linear motion of the atmospheric transfer robot $RB_2$ in accordance with commands from a controller.

Next, an explanation will be given of a basic wafer transfer operation for transferring one of the wafers from a wafer cassette CR placed in one of the load port devices LP into this cluster tool to perform a series of processes on the wafer.

At first, one wafer W is taken out by the transfer robot $RB_2$ of the loader module LM from a wafer cassette CR placed in one of the load port devices LP. Then, the wafer W is transferred into the orientation-flat alignment mechanism ORT, in which the wafer W is subjected to orientation-flat alignment. Then, the wafer W is transferred into one of the load-lock modules $LLM_1$ and $LLM_2$ (for example, $LLM_1$). The interior of the load-lock module $LLM_1$ is set to be in an atmospheric pressure state when receiving the wafer W, and is then vacuum-exhausted after receiving the wafer W. Then, the load-lock module $LLM_1$ is set to be in a vacuum state when the wafer W is transferred by the vacuum transfer robot $RB_1$ of the transfer module TM.

The wafer W is transferred by one of the transfer arms $F_A$ and $F_B$ of the transfer robot $RB_1$ from the load-lock module $LLM_1$ into a first process module (for example, $PM_1$). In the first process module $PM_1$, the wafer W is subjected to a single-wafer process of the first step under predetermined process conditions (such as gas, pressure, electric power, and time) in accordance with a preset recipe.

After the single-wafer process of the first step is finished, the wafer W is transferred by the transfer robot $RB_1$ out of the first process module $PM_1$. Then, the wafer W is transferred by the transfer robot $RB_1$ from the first process module $PM_1$ into a second process module (for example, $PM_2$). In the second process module $PM_2$, the wafer W is subjected to a single-wafer process of the second step under predetermined process conditions in accordance with a preset recipe.

After the single-wafer process of the second step is finished, the wafer W is transferred by the transfer robot $RB_1$ out of the second process module $PM_1$. Then, where a subsequent step is to be performed, the wafer W is transferred by the transfer robot $RB_1$ from the second process module $PM_1$ into a third process module (for example, $PM_3$ or $PM_4$). Where no subsequent step is to be performed, the wafer W is transferred into one of the load-lock modules $LLM_1$ and $LLM_2$. After a process is performed in the third process module and so on, where a subsequent step is to be performed, the wafer W is transferred into a subsequent process module. Where no subsequent step is to be performed, the wafer W is transferred into one of the load-lock modules $LLM_1$ and $LLM_2$.

Thus, the wafer W is subjected to a series of processes by a plurality of process modules $PM_1$, $PM_2$, and so forth in the cluster tool. After the wafer W is transferred into one of the load-lock modules (for example, $LLM_2$), the interior of the load-lock module $LLM_2$ is switched from a vacuum state to an atmospheric pressure state. Thereafter, the wafer W is returned from the load-lock module $LLM_2$ set to have an atmospheric pressure state to the corresponding wafer cassette CR by the transfer robot $RB_2$ of the loader module LM. The load-lock modules $LLM_1$ and $LLM_2$ may be arranged to perform a heating or cooling process on a accommodated wafer W in a predetermined atmosphere.

As described above, this cluster tool is arranged to sequentially perform a series of processes on a wafer, while sequentially transferring the wafer through a plurality of process modules within a vacuum. Particularly, in the case of vacuum processes for forming thin films, predetermined thin films can be formed and stacked by in-line processing, while different film formation processes are continuously performed by a plurality of process modules. Further, since single-wafer processes can be sequentially repeated by a pipeline system formed of a plurality of process modules, it is possible to realize a high operation rate and productivity.

Figure 2:
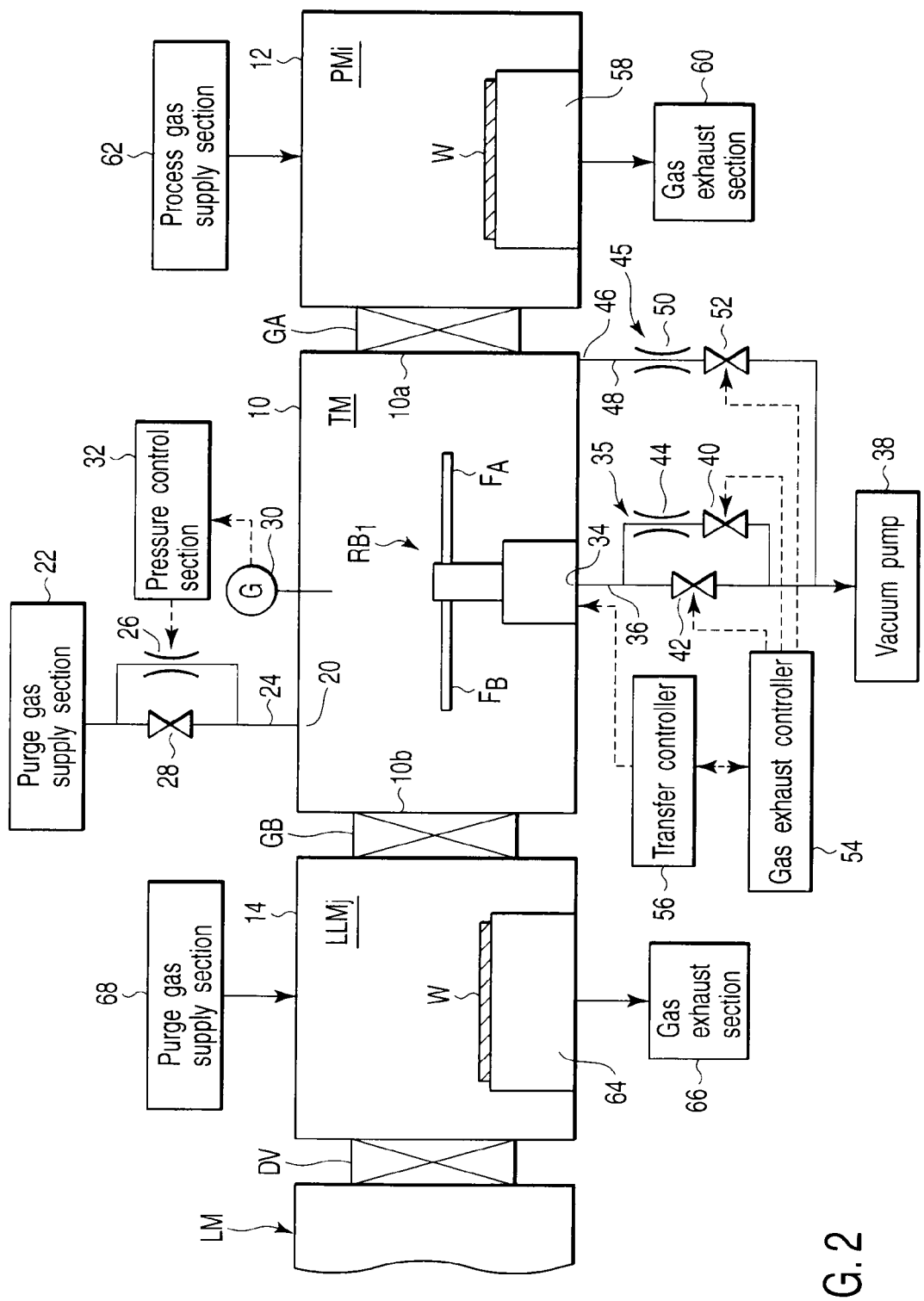
FIG. 2 is a sectional side view schematically showing the structure of a main part of the vacuum processing system shown in FIG. 1.

FIG. 2 is a sectional side view schematically showing the structure of a main part of the vacuum processing system shown in FIG. 1. As shown in FIG. 2, the transfer chamber 10 of the transfer module TM is connected to the process chamber 12 of each process module $PM_i$ (i=1, 2, 3, 4) and the load-lock chamber 14 of each load-lock module $LLM_j$ (j=1, 2).

The transfer chamber 10 of the transfer module TM has a first wafer transfer port 10a and a second wafer transfer port 10b formed in the sidewall. The first wafer transfer port 10a is connected to the wafer transfer port of each process module $PM_i$ through a gate valve GA. The second wafer transfer port 10b is connected to the load-lock chamber 14 of each load-lock module $LLM_j$ through a gate valve GB. The transfer chamber 10 has a gas supply port 20 disposed at an upper position preferably higher than the transfer robot $RB_1$, e.g., at the ceiling. The gas supply port 20 is connected to a purge gas supply section 22 through a gas supply line 24. The gas supply line 24 is provided with a flow rate control valve 26 and a switching valve 28 disposed in parallel with each other. For example, the flow rate control valve 26 is formed of a proportional control valve.

In the normal mode, a purge gas or pressure-adjusting gas, such as $N_2$ gas is supplied from the purge gas supply section 22 through the flow rate control valve 26 into the transfer chamber 10. A vacuum gauge 30 is disposed at the ceiling of the transfer chamber 10, for measuring the inner pressure. A pressure control section 32 is arranged to adjust the opening degree of the flow rate control valve 26 by a feed-back method, so as to bring the output signal (pressure measurement value) of the vacuum gauge 30 into line with a preset pressure. The preset pressure is selected to be an optimum value slightly higher than the pressure inside the process chamber 12. In the normal mode, the switching valve 28 is held in the closed state. The switching valve 28 is opened when the transfer chamber 10 is roughly vacuum-exhausted to return the interior thereof to a vacuum state, after the transfer chamber 10 is once set to be opened to the atmosphere for a maintenance operation or the like.

On the other hand, the transfer chamber 10 has one or more exhaust ports (common exhaust ports) 34 formed in the bottom, at or near the central portion. The central exhaust ports 34 are connected to a vacuum pump 38 through an exhaust line 36. The exhaust line 36 is provided with two switching valves 40 and 42 disposed in parallel with each other. One of the flow passages, which has the switching valve 40, is further provided with a flow rate control valve 44. For example, the flow rate control valve 44 is formed of a throttle valve. The central exhaust port(s) 34, exhaust line 36, vacuum pump 38, switching valve 40 (42), and flow rate control valve 44 constitute a central gas exhaust section 35.

Further, the transfer chamber 10 has peripheral exhaust ports (individual exhaust ports) 46 formed in the bottom respectively near or at the foot of the gate valves GA of the process chambers 12. Each peripheral exhaust port 46 is connected to the vacuum pump 38 through an exhaust line 48. The exhaust line 48 is provided with a flow rate control valve 50 and a switching valve 52 disposed thereon. For example, the flow rate control valve 50 is formed of a throttle valve. The peripheral exhaust port 46, exhaust line 48, vacuum pump 38, flow rate control valve 50, and switching valve 52 constitute a peripheral gas exhaust section 45. The peripheral gas exhaust section 45 is disposed for each gate valve GA, i.e., each process module $PM_i$ (i=1, 2, 3, 4). The width of the peripheral exhaust port 46 is set to be not less than the width of the opening of the gate valve GA.

For example, each of the switching valves 40, 42, and 52 is formed of an air operation valve, and is controlled to be opened/closed (on/off) by a gas exhaust controller 54. Of them, the switching valve 42 is held in the closed state in the normal mode. The switching valve 42 is opened when the transfer chamber 10 is roughly vacuum-exhausted to return the interior thereof to a vacuum state, after the transfer chamber 10 is once set to be opened to the atmosphere for a maintenance operation or the like.

In a vacuum state in the normal mode, the central gas exhaust section 35 and the respective peripheral gas exhaust sections 45 are selected and switched therebetween for an exhaust operation, in response to the opening/closing operation of the respective gate valves GAs, as described later. When the respective peripheral gas exhaust sections 45 are disabled for an exhaust operation while the central gas exhaust section 35 is enabled for an exhaust operation, the switching valves 52 are closed while the switching valve 40 is solely opened. At this time, the gas inside the transfer chamber 10 is gathered from all directions to the central portion, and is exhausted through the central exhaust ports 34. When the central gas exhaust section 35 is disabled for an exhaust operation while a specific peripheral gas exhaust section 45 is enabled for an exhaust operation, the switching valve 52 of this specific peripheral gas exhaust section 45 is solely opened while the switching valves 52 of all the other peripheral gas exhaust sections 45 and the switching valve 40 of the central gas exhaust section 35 are closed. At this time, the gas inside the transfer chamber 10 is gathered to one peripheral position, i.e., toward the gate valve GA corresponding to this peripheral gas exhaust section 45, and is exhausted through this peripheral exhaust port 46.

Normally, the exhaust flow rate of the central gas exhaust section 35 and the exhaust flow rate of each peripheral gas exhaust section 45 are set to be almost the same. Further, the flow rate of $N_2$ gas supplied from the purge gas supply section side (22 to 32) into the transfer chamber 10 is adjusted to control and maintain the pressure inside the transfer chamber 10 at a preset value. The preset pressure is selected to be an optimum value slightly higher than the pressure inside the process chamber 12 of each process module $PM_i$.

The gas exhaust controller 54 receives a predetermined control signal or timing signal from a transfer controller 56, and controls the opening/closing operations of the switching valves 40 and 52 at a predetermined timing. The transfer controller 56 is arranged to control the transfer operation of the vacuum transfer robot $RB_1$ and the opening/closing operations of the gate valves GA and GB in association with the transfer operation, as described later in detail.

Each process module $PM_i$ has a worktable or susceptor 58 disposed in the process chamber 12, for supporting a semiconductor wafer W and controlling the wafer temperature. Further, utility supply mechanisms are disposed outside the process chamber 12, and are operated in accordance with a recipe. For example, there is a gas exhaust section 60 for decreasing the pressure inside the process chamber 12 to a predetermined vacuum pressure, and a process gas supply section 62 for supplying predetermined process gases into the process chamber 12.

Each load-lock module $LLM_j$ has a table 64 disposed in the load-lock chamber 14, for supporting a semiconductor wafer W. The table 64 is provided with a lifter pin mechanism (not shown), which can support a semiconductor wafer W in a horizontal state and move it up and down when the wafer W is transferred between the table 64 and transfer robot. Further, for example, there is a gas exhaust section 66 for vacuum-exhausting the interior of the load-lock chamber 14, and a purge gas supply section 68 for supplying a purge gas when the interior of the load-lock chamber 14 is switched from a vacuum state to an atmospheric pressure state. The pressure inside the load-lock chamber 14 in a vacuum state may be set at value slightly higher than the pressure inside the transfer chamber 10.

Figure 3:
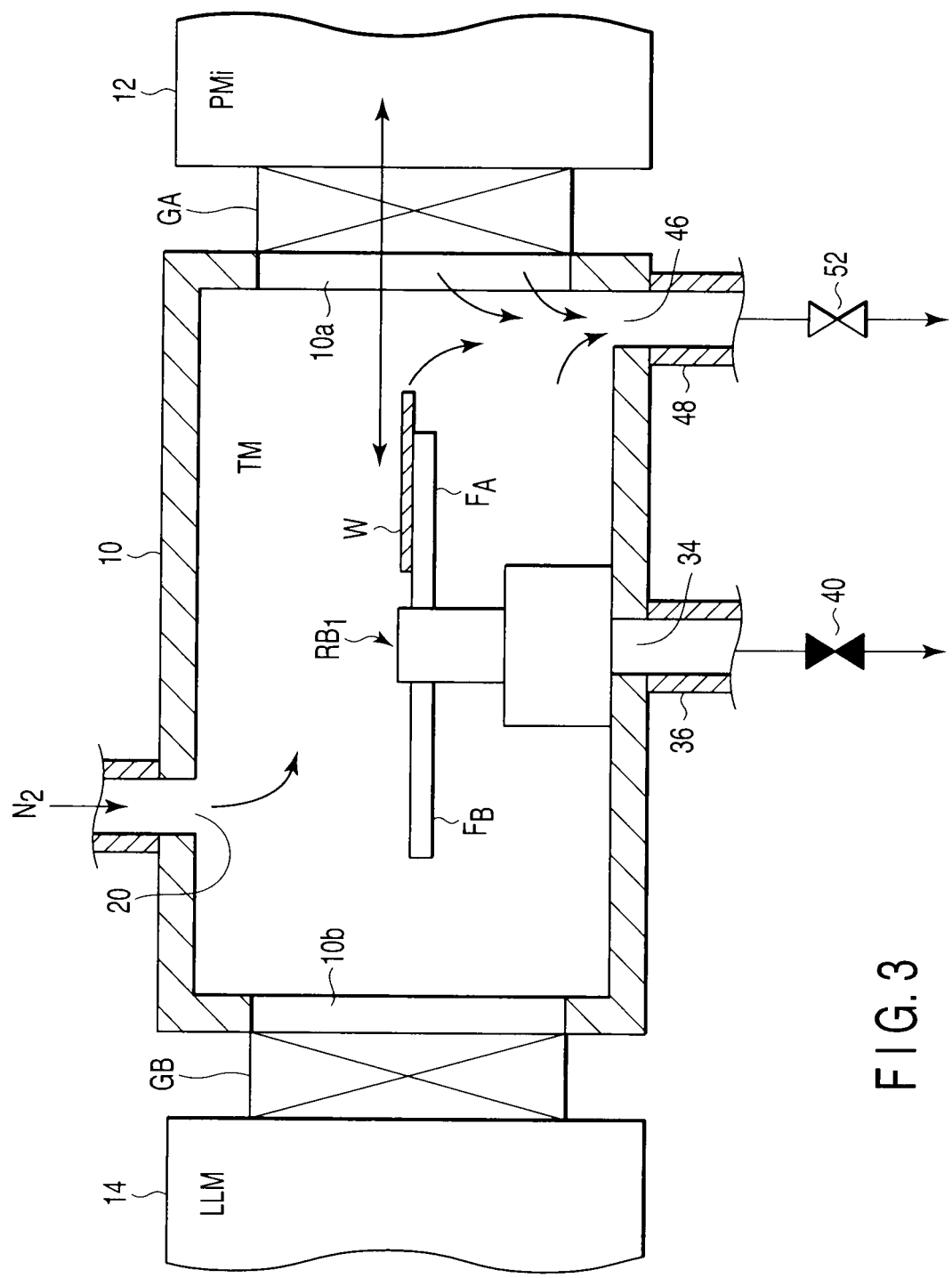
FIG. 3 is an enlarged sectional view schematically showing an operation of the vacuum processing system shown in FIG. 1.

FIG. 3 is an enlarged sectional view schematically showing an operation of the vacuum processing system shown in FIG. 1. An explanation will be given of control for switching the exhaust ports of the transfer module TM in this embodiment, with reference to FIGS. 2 and 3. For example, this exhaust port switching control may be used in the following sequence. In summary, one wafer W is transferred from a load-lock module $LLM_j$ through the transfer module TM into a certain process module $PM_i$. Then, the wafer W after being processed is returned from this process module $PM_i$ through the transfer module TM into the load-lock module $LLM_j$.

As described above, an unprocessed wafer W is transferred into the load-lock module $LLM_j$ set to have an atmospheric pressure state (door valve DV is opened) by the atmospheric transfer robot $RB_2$ of the loader module LM. Then, the pressure inside the load-lock chamber 14 is decreased to a predetermined vacuum level by vacuum exhaust, and then the gate valve GB is opened. Then, the wafer W is transferred out of the load-lock chamber 14 by the vacuum transfer robot $RB_1$ of the transfer module TM. In this case, under the control of the transfer controller 56, the gate valve GB is opened at the timing when the vacuum transfer robot $RB_1$ accesses the load-lock module $LLM_j$. Then, the gate valve GB is closed immediately after the wafer W is transferred out of the load-lock chamber 14 by the vacuum transfer robot $RB_1$.

For the transfer chamber 10 of the transfer module TM, there is a period in which no wafer W is transferred into or from any process module $PM_i$ (i=1 to 4), and thus all the gate valves GA are in the closed state. During this period, all the peripheral gas exhaust sections 45 are disabled for an exhaust operation, while the central gas exhaust section 35 is solely enabled for an exhaust operation. At this time, the gas inside the vacuum process chamber 10 is gathered to and exhausted through the central exhaust ports 34 formed at the central portion.

However, in the example described above, there is a case where a wafer W is transferred from the load-lock module LLM$_j$ into a destination process module PM$_i$ by the vacuum transfer robot RB$_1$. In this case, immediately before the gate valve GA of this process module PM$_i$ is opened, the central gas exhaust section 35 is disabled for an exhaust operation, and the peripheral gas exhaust section 45 corresponding to (adjacent to) this gate valve GA is enabled for an exhaust operation, substantially simultaneously by the gas exhaust controller 54 in response to a timing control signal from the transfer controller 56. Further, all the other peripheral gas exhaust sections 45 are kept disabled for an exhaust operation.

When this gate valve GA is opened, the transfer chamber 10 of the transfer module TM communicates with the process chamber 12 of this process module PM$_i$. At this time, the pressure inside the transfer chamber 10 is maintained to be higher than that inside this process chamber 12, as described above. Further, in the transfer chamber 10, the peripheral exhaust port 46 formed at the foot of this gate valve GA is the sole exhaust port in operation for exhausting gas. Accordingly, the gas inside the transfer chamber 10 is caused to flow toward this gate valve GA or peripheral exhaust port 46 from all directions. Because of a combination of the pressure difference effect with the local exhaust, as described above, it is less possible for the process atmosphere inside this process chamber 12 to flow into the transfer chamber 10, even when a transfer arm of the vacuum transfer robot RB$_1$ or wafer W passes through this gate valve GA in an opened state. As shown in FIG. 3, even if the process atmosphere flows in, it is drawn to this peripheral exhaust port 46 present directly below, and is swiftly exhausted therethrough. Consequently, there is never such a case where the process atmosphere inside this process chamber 12 is spread inside the transfer chamber 10 (backward diffusion).

After the wafer W is transferred into the process chamber 12 of this process module PM$_i$ by the transfer arm (for example, F$_A$) of the vacuum transfer robot RB$_1$ and then the transfer arm is retreated, this gate valve GA is closed. At this time, this peripheral gas exhaust section 45 is disabled for an exhaust operation, and the central gas exhaust section 35 is enabled again for an exhaust operation, substantially simultaneously by the gas exhaust controller 54 in response to a timing signal from the transfer controller 56. Consequently, the gas inside the vacuum process chamber 10 is gathered again toward the central portion, and is exhausted through the central exhaust ports 34.

After the process of this process module PM$_i$ is finished, the vacuum transfer robot RB$_1$ accesses the process module PM$_i$ to transfer the process wafer W, and the gate valve GA is opened. Also at this time, immediately before this gate valve GA is opened, the central gas exhaust section 35 is disabled for an exhaust operation, and the peripheral gas exhaust section 45 corresponding to (adjacent to) this gate valve GA is enabled for an exhaust operation, substantially simultaneously by the gas exhaust controller 54 in response to a timing signal from the transfer controller 56. Consequently, because the same local exhaust effect works in the transfer chamber 10 as in the time when the wafer is transferred into the process module PM$_i$, the process atmosphere inside this process chamber 12 is reliably prevented from being spread in the transfer chamber 10 (backward diffusion), even when the transfer chamber 10 communicates with the process chamber 12.

After the processed wafer W is transferred out of the process chamber 12 of this process module PM$_i$ by the transfer arm (for example, F$_A$) of the vacuum transfer robot RB$_1$, the corresponding gate valve GA is closed. Then, this peripheral gas exhaust section 45 is disabled for an exhaust operation, and the central gas exhaust section 35 is enabled again for an exhaust operation, substantially simultaneously by the gas exhaust controller 54 in response to a timing signal from the transfer controller 56. Thereafter, the central gas exhaust section 35 is solely kept enabled for an exhaust operation even while the gate valve GB is in an opened state to return the wafer W to the load-lock chamber 14 by the vacuum transfer robot RB$_1$.

In summary, according to this embodiment, the following control may be performed by the control section (including the gas exhaust controller 54 and transfer controller 56 shown in FIG. 2). Specifically, in a first period during which all the gate valves GA of the process chamber 12 are closed, the common gas exhaust section (central gas exhaust section 35) is enabled. Then, in a second period of from immediately before the gate valve GA of a certain process chamber 12 is opened to immediately after the gate valve GA is closed, the common gas exhaust section (central gas exhaust section 35) is disabled, while the individual gas exhaust section (peripheral gas exhaust section 45) corresponding to this gate valve GA is enabled.

The manner described above of a round-trip transfer of a wafer W through the load-lock chamber 14, transfer module TM, and process module PM$_i$, and the exhaust port switching control in association therewith is a mere example. Particularly, according to this cluster tool, processes may be concurrently performed by a plurality of process modules PM$_1$, PM$_2$, PM$_3$, and PM$_4$ with the serial transfer of wafers, and thus the transfer sequence and/or exhaust port switching control may be realized in various manners. However, where a wafer W is transferred to or from any one process module PM$_i$ in the cluster tool, the necessary operation is almost the same as that of the round-trip transfer described above. Further, in practical applications, there is scarcely a case where wafers W are transferred to and from two process modules (for example, PM$_1$ and PM$_3$) at the same time, i.e., two gate valves GA are opened at the same time. Accordingly, in general, where a wafer is transferred to and from each process module PM$_i$ (a gate valve is opened/closed), the exhaust port switching control is performed in the same manner used in the round-trip transfer described above.

Even if there is an application where a plurality of gate valves GA are opened at the same time in the cluster tool, the present invention can be used. In this case, only the peripheral gas exhaust sections 45 corresponding to (adjacent to) the gate valves GA opened at the same time are enabled for an exhaust operation. Also in this case, local exhaust is performed near each gate valve GA, so the process atmosphere inside the corresponding process chamber 12 is reliably prevented from being spread in the transfer chamber 10 (backward diffusion) by each peripheral gas exhaust section 45.

As described above, in the vacuum processing system of the cluster tool type according to this embodiment, when the gate valve GA connecting the transfer chamber 10 of the transfer module TM to the process chamber 12 of one of process modules PM$_1$, PM$_2$, PM$_3$, and PM$_4$ is opened, the process atmosphere inside the process chamber 12 is reliably prevented from being spread in the transfer chamber 10 (backward diffusion). Consequently, it is possible to effectively suppress or reduce problems, such as corrosion, contamination, and particle generation, being caused inside the transfer chamber 10.

Figure 4:
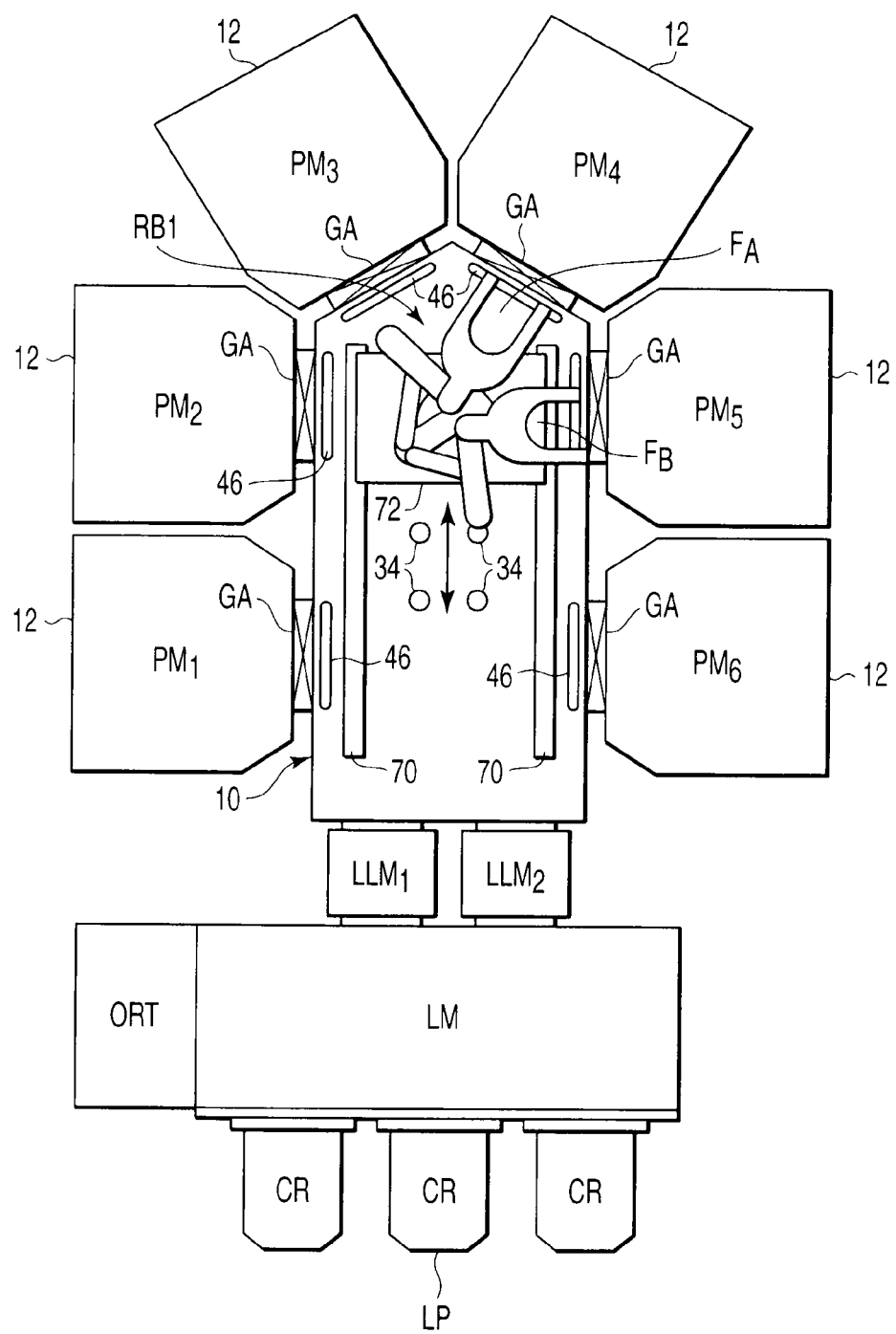
FIG. 4 is a sectional plan view schematically showing the entire structure of a vacuum processing system according to a modification of the first embodiment.

FIG. 4 is a sectional plan view schematically showing the entire structure of a vacuum processing system according to a modification of the first embodiment. The vacuum processing system according to this modification is also of the so-called cluster tool type, which is set up inside a clean room. This system includes a transfer module TM, which is provided with two rails 70 disposed therein to extend in the longitudinal direction, and a transfer robot $RB_1$ having a slider 72 linearly movable on the rails 70. The transfer module TM can be connected to six process modules PM at the most. The transfer robot $RB_1$ has a pair of transfer arms $F_A$ and $F_B$, which are extensible/contractible in two directions forming an acute angle (for example, 60°). With this arrangement, when the transfer arms $F_A$ and $F_B$ are alternately inserted into each module by a pick-and-place operation, the necessary swing angle of the transfer robot $RB_1$ can be smaller. Also in this cluster tool, as in the embodiment described above (shown in FIGS. 1 to 3), the transfer chamber 10 of the transfer module TM has exhaust ports 46 respectively formed near or at the foot of the gate valves GA connecting the transfer chamber 10 to the process chambers 12 of the process modules PM. Further, the transfer chamber 10 has one or more central exhaust ports 34 preferably formed at or near the central portion.

Figure 5:
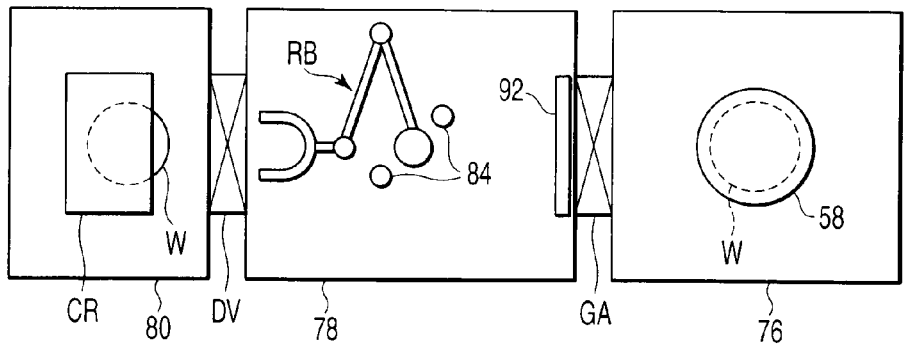
FIG. 5 is a sectional plan view schematically showing the structure of a vacuum processing system according to a second embodiment of the present invention.
Figure 6:
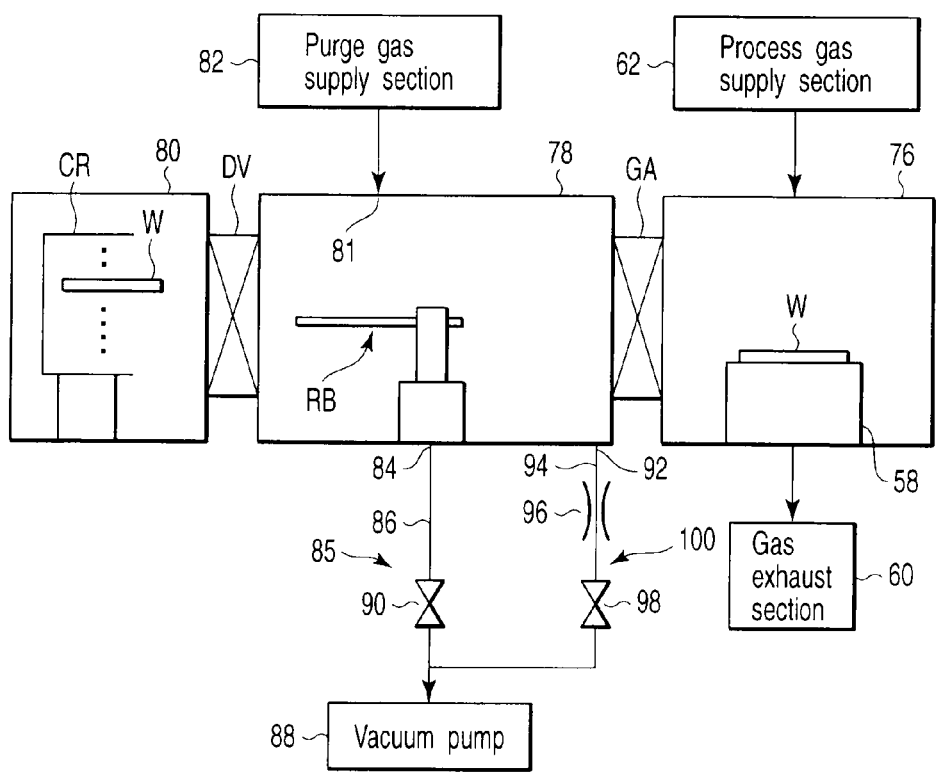
FIG. 6 is a sectional side view schematically showing the structure of the vacuum processing system shown in FIG. 5.

FIG. 5 is a sectional plan view schematically showing the structure of a vacuum processing system according to a second embodiment of the present invention. FIG. 6 is a sectional side view schematically showing the structure of the vacuum processing system shown in FIG. 5. The vacuum processing system according to the second embodiment includes a vacuum process chamber 76 structured as a load-lock chamber, which is connected through a gate valve GA to a transfer chamber 78. The load-lock chamber 78 is provided with a transfer robot $RB_3$ disposed therein. The load-lock chamber 78 is further connected through a door valve GV to a cassette chamber 80, in which a wafer cassette CR capable of storing one batch of semiconductor wafers W (for example, 25 wafers) is placed at atmospheric pressure.

An unprocessed wafer W is taken out of the wafer cassette CR inside the cassette chamber 80 by the transfer robot $RB_3$ of the load-lock chamber 78 set to have atmospheric pressure (the door valve DV is in an opened state). After the wafer W is taken into the load-lock chamber 78, the door valve DV is closed, and the interior of the load-lock chamber 78 is vacuum-exhausted to a predetermined pressure. After this vacuum exhaust, the gate valve GA is opened at a predetermined timing, and the wafer W is transferred into the vacuum process chamber 76 by the transfer robot RB in a vacuum state. In this case, a pick-and-place operation may be performed, i.e., a wafer W immediately after being processed in the vacuum process chamber 76 is first taken out by one of the arms, and then the unprocessed wafer W is transferred into the vacuum process chamber 76 by the other of the arms. After the wafer W is transferred into the vacuum process chamber 76, the gate valve GA is closed. In the vacuum process chamber 76, a predetermined vacuum process is performed while using predetermined utilities (such as process gas, RF power, and heat).

As described above, the wafer W is transferred in a vacuum state between the load-lock chamber 78 and vacuum process chamber 76. When the wafer W after being processed is returned from the load-lock chamber 78 to the wafer cassette CR inside the cassette chamber 80, the interior of the load-lock chamber 78 is switched from a vacuum state to an atmospheric pressure state. Then, the door valve DV is opened, and the processed wafer W is transferred to a predetermined position inside the wafer cassette CR by the transfer robot RB.

As a modification, the load-lock chamber 78 may be connected through a door valve DV to a loader module LM (see FIG. 1) in place of the cassette chamber 80. In this case, the load-lock chamber 78 is provided with a wafer table disposed therein at a position (near the door valve DV) accessible by both of the transfer robot $RB_3$ of the load-lock chamber 78 and the atmospheric transfer robot $RB_2$ of the loader module LM.

As described above, the load-lock chamber 78 has basically the same structure and function as those of the transfer chamber 10 of the transfer module TM according to the first embodiment, except that the interior of the load-lock chamber 78 can be selectively switched between a vacuum state and an atmospheric pressure state.

Specifically, the load-lock chamber 78 has a gas supply port 81 disposed at an upper position, e.g., at the ceiling, and connected to a purge gas supply section 82. For example, this purge gas supply section 82 has the same structure as that of the purge gas supply section (22 to 32) of the first embodiment. However, in the normal mode, the switching valve (28) is operated for opening/closing. Specifically, when the interior of the load-lock chamber 78 is switched from a vacuum state to an atmospheric pressure state, the switching valve (28) is opened, and a purge gas is supplied from the purge gas supply section (22) through the opened switching valve (28) into the load-lock chamber 78. When the pressure inside the load-lock chamber 78 is maintained at a constant value after it is switched from an atmospheric pressure state to a vacuum state, the feed-back loop of the vacuum gauge (30), pressure control section (32), and flow rate control valve (26) is used while the switching valve (28) is maintained in the closed state.

The load-lock chamber 78 has one or more central exhaust ports 84 formed in the bottom, at or near the central portion. The central exhaust ports 84 are connected to a vacuum pump 88 through an exhaust line 86. The exhaust line 86 is provided with a switching valve 90. The central exhaust port(s) 84, exhaust line 86, vacuum pump 88, and switching valve 90 constitute a central gas exhaust section 85.

Further, the load-lock chamber 78 has a peripheral exhaust port 92 formed in the bottom near or at the foot of the gate valve GA of the vacuum process chamber 76. The peripheral exhaust port 92 is connected to the vacuum pump 88 through an exhaust line 94. The exhaust line 94 is provided with a flow rate control valve 96 and a switching valve 98 disposed thereon. The peripheral exhaust port 92, exhaust line 94, vacuum pump 88, flow rate control valve 96, and switching valve 98 constitute a peripheral gas exhaust section 100. For example, the flow rate control valve 96 is formed of a throttle valve. The peripheral gas exhaust section 100 has a lower exhaust performance than that of the central gas exhaust section 85, such as about ½. The width of the peripheral exhaust port 92 is set to be not less than the width of the opening of the gate valve GA.

For example, each of the switching valves 90 and 98 used for turning on/off the central gas exhaust section 85 and peripheral gas exhaust section 100 for an exhaust operation is formed of an air operation valve. The switching valves 90 and 98 are controlled to be opened/closed by the same controller (not shown) as the gas exhaust controller 54 of the first embodiment.

As described above, when the interior of the load-lock chamber 78 is switched from an atmospheric pressure state to a vacuum state after receiving an unprocessed wafer W, the purge gas from the purge gas supply section 82 is stopped, and the interior of the load-lock chamber 78 is roughly exhausted by the central gas exhaust section 85 having a higher exhaust performance. The peripheral gas exhaust section 100 is typically disabled for an exhaust operation at this time, although it may be simultaneously enabled for an exhaust operation. Consequently, the gas inside the load-lock chamber 78 is gathered from all directions to the central portion, and is exhausted through the central exhaust ports 84.

After the load-lock chamber 78 reaches a preset pressure by this vacuum exhaust, the central gas exhaust section 85 is disabled for an exhaust operation, while the peripheral gas exhaust section 100 is enabled for an exhaust operation. Further, a purge gas starts being supplied from the purge gas supply section 82 under feed-back control to maintain the pressure inside the load-lock chamber 78 at a preset value. Then, the gate valve GA is opened when the unprocessed wafer W is transferred from the load-lock chamber 74 into the vacuum process chamber 76. Further, the gate valve GA is opened when a processed wafer W is transferred from the vacuum process chamber 76 into the load-lock chamber 78. At these times, the load-lock chamber 78 communicates with the vacuum process chamber 76 through the gate valve GA in an opened state. However, because the peripheral gas exhaust section 100 is enabled for an exhaust operation, and a local exhaust effect works in the load-lock chamber 78, the process atmosphere inside the vacuum process chamber 76 is reliably prevented from being spread in the load-lock chamber 78 (backward diffusion).

In summary, according to this embodiment, the following control may be performed by the control section (including the gas exhaust controller 54 and transfer controller 56 shown in FIG. 2). Specifically, in a first period during which the door valve DV is in an opened state, the first gas exhaust section (peripheral gas exhaust section 100) and second gas exhaust section (central gas exhaust section 85) are disabled. Then, in a second period during which the door valve DV is in the closed state and the pressure inside the load-lock chamber 78 is decreased from atmospheric pressure to a vacuum, the second gas exhaust section (central gas exhaust section 85) is enabled. Then, in a third period during which the interior of the load-lock chamber 78 is maintained in a vacuum state and the gate valve GA is in the closed state, the second gas exhaust section (central gas exhaust section 85) is disabled, while the first gas exhaust section (peripheral gas exhaust section 100) is enabled. Then, in a fourth period of from immediately before the gate valve GA is opened to immediately after the gate valve GA is closed while the interior of the load-lock chamber 78 is in a vacuum state, the second gas exhaust section (central gas exhaust section 85) is disabled, while the first gas exhaust section (peripheral gas exhaust section 100) is enabled.

Figure 7:
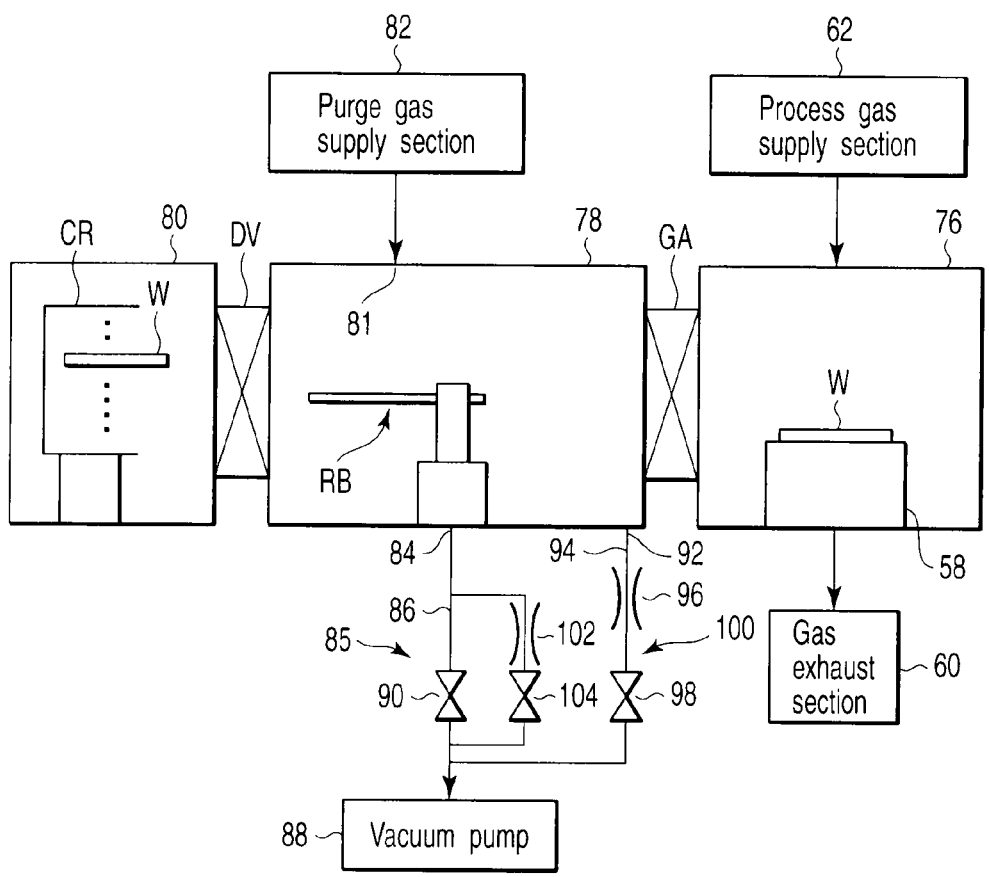
FIG. 7 is a sectional side view schematically showing the structure of a vacuum processing system according to a modification of the second embodiment.

FIG. 7 is a sectional side view schematically showing the structure of a vacuum processing system according to a modification of the second embodiment. The vacuum processing system according to this modification has a central gas exhaust section 85 including a bypass flow passage connected in parallel with a switching valve 90. The bypass flow passage is provided with a flow rate control valve 102 and a switching valve 104 disposed thereon to have a lower exhaust flow rate (and thus have a lower exhaust performance than the switching valve 90 side). While the load-lock chamber 78 is maintained in a vacuum state, the peripheral gas exhaust section 100 is enabled for an exhaust operation only when the gate valve GA is opened. In the other time while the load-lock chamber 78 is maintained in a vacuum state, the central gas exhaust section 85 (by the flow rate control valve 102 and switching valve 104) is enabled for an exhaust operation.

Further, in summary, according to this embodiment, the following control may be performed by the control section (including the gas exhaust controller 54 and transfer controller 56 shown in FIG. 2). Specifically, in a first period during which the door valve DV is in an opened state, the first gas exhaust section (peripheral gas exhaust section 100), second gas exhaust section (central gas exhaust section 85 through the switching valve 90), and third gas exhaust section (central gas exhaust section 85 through the switching valve 104) are disabled. Then, in a second period during which the door valve DV is in the closed state and the pressure inside the load-lock chamber 78 is decreased from atmospheric pressure to a vacuum, the second gas exhaust section (central gas exhaust section 85 through the switching valve 90) is enabled. Then, in a third period during which the interior of the load-lock chamber 78 is maintained in a vacuum state and the gate valve GA is in the closed state, the second gas exhaust section (central gas exhaust section 85 through the switching valve 90) is disabled, while the third gas exhaust section (central gas exhaust section 85 through the switching valve 104) is enabled. Then, in a fourth period of from immediately before the gate valve GA is opened to immediately after the gate valve GA is closed while the interior of the load-lock chamber 78 is in a vacuum state, the second and third gas exhaust sections (central gas exhaust section 85 through the switching valves 90 and 104) are disabled, while the first gas exhaust section (peripheral gas exhaust section 100) is enabled.

As described above, also in this embodiment, when the gate valve GA connecting the load-lock chamber 78 to the vacuum process chamber 76 is opened, the process atmosphere inside the vacuum process chamber 76 is reliably prevented from being spread in the load-lock chamber 78 (backward diffusion). Consequently, it is possible to effectively suppress or reduce problems, such as corrosion, contamination, and particle generation, being caused inside the load-lock chamber 78.

The present invention has been described with reference to the specific embodiments, but they do not limit the present invention. For example, in the present invention, the shape of peripheral exhaust ports 46 (92) is not limited to a slit shown in the drawings, and it may be circular or rectangular, or it may be formed of a plurality of holes. The shape and number of the central exhaust ports 34 (84) can be arbitrarily changed. The peripheral gas exhaust sections 45 (100) may employ a vacuum pump separately from the vacuum pump of the central gas exhaust sections 35 (85). The arrangement of the purge gas supply section 82 (22 to 32) and the position of the gas supply port 20 (81) may be modified in various manners. Further, the target object of the present invention is not limited to a semiconductor wafer, and it may be one of various substrates for, e.g., flat panel displays, photo-masks, CD substrates, and printed circuit boards.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method for using a vacuum processing system, the method comprising:
   a first standby step of setting a first gate valve, positioned between a transfer chamber and a process chamber, closed and setting a central gas exhaust section, which is connected to a central exhaust port formed in a bottom of the transfer chamber, enabled to exhaust gas from inside the transfer chamber with a target object present therein;
   then, a first vacuum transfer step of setting the first gate valve open and transferring the target object by a transfer mechanism disposed in the transfer chamber through the first gate valve from the transfer chamber into the process chamber, with an operation of setting the central gas exhaust section disabled while setting a peripheral gas exhaust section, which is connected to a peripheral exhaust port formed in the bottom of the transfer chamber at a foot of the first gate valve, enabled in a period of from immediately before opening the first gate valve to immediately after closing the first gate valve;

then, a second standby step of setting the first gate valve closed and setting the peripheral gas exhaust section disabled while setting the central gas exhaust section enabled to exhaust gas from inside the transfer chamber, with the target object being processed inside the process chamber; and then, a second vacuum transfer step of setting the first gate valve open and transferring the target object by the transfer mechanism through the first gate valve from the process chamber into the transfer chamber, with an operation of setting the central gas exhaust section disabled while setting the peripheral gas exhaust section enabled in a period of from immediately before opening the first gate valve to immediately after closing the first gate valve.

2. The method according to claim 1, wherein the first standby step includes setting the peripheral gas exhaust section disabled.

3. The method according to claim 1, wherein the central gas exhaust section has an exhaust performance higher than that of the peripheral gas exhaust section.

4. The method according to claim 1, wherein the peripheral and central gas exhaust sections are connected to a common vacuum pump through exhaust passages respectively provided with switching valves, and setting the peripheral and central gas exhaust sections enabled/disabled is performed by opening/closing the switching valves in the method.

5. The method according to claim 2, wherein the first and second standby steps include supplying a purge gas into the transfer chamber from a gas supply section, which is connected to a gas supply port disposed in the transfer chamber at a position higher than the transfer mechanism, to set a pressure inside the transfer chamber higher than that inside the process chamber.

6. The method according to claim 1, wherein a load-lock chamber is connected to the transfer chamber through a second gate valve, and capable of adjusting an inner pressure thereof between atmospheric pressure and a vacuum, wherein no exhaust port is formed in the bottom of the transfer chamber at a foot of the second gate valve.

7. The method according to claim 1, wherein the peripheral exhaust port has a width not smaller than an opening width of the first gate valve.

8. A method for using a vacuum processing system, the method comprising:

an atmospheric transfer step of setting a first gate valve, positioned between a transfer chamber and a process chamber, closed and a door valve, positioned between the transfer chamber and an atmospheric pressure space, open and transferring a target object by a transfer mechanism disposed in the transfer chamber through the door valve into the transfer chamber, with an operation of setting peripheral and central gas exhaust sections disabled in a period during which the door valve is open, wherein the transfer chamber is a load-lock chamber capable of adjusting an inner pressure thereof between atmospheric pressure and a vacuum, and the peripheral and central gas exhaust sections are respectively connected to peripheral and central exhaust ports formed in a bottom of the transfer chamber, the peripheral exhaust port being at a foot of the first gate valve;

then, a pressure-decreasing step of decreasing a pressure inside the transfer chamber with the target object present therein from atmospheric pressure to a vacuum by setting the first gate valve closed and the door valve closed and setting the central gas exhaust section enabled;

then, a first vacuum transfer step of setting the door valve closed and the first gate valve open and transferring the target object by the transfer mechanism through the first gate valve from the transfer chamber into the process chamber, with an operation of setting the central gas exhaust section disabled while setting the peripheral gas exhaust section enabled in a period of from immediately before opening the first gate valve to immediately after closing the first gate valve;

then, a standby step of setting the first gate valve closed and setting the peripheral gas exhaust section disabled while setting the central gas exhaust section enabled to exhaust gas from inside the transfer chamber, with the target object being processed inside the process chamber; and then, a second vacuum transfer step of setting the first gate valve open and transferring the target object by the transfer mechanism through the first gate valve from the process chamber into the transfer chamber, with an operation of setting the central gas exhaust section disabled while setting the peripheral gas exhaust section enabled in a period of from immediately before opening the first gate valve to immediately after closing the first gate valve.

9. The method according to claim 8, wherein the pressure-decreasing step includes setting the peripheral gas exhaust section disabled.

10. The method according to claim 8, wherein the method further comprises a holding step of holding a vacuum inside the transfer chamber by setting the first gate valve closed and the door valve closed and setting the central gas exhaust section disabled while setting the peripheral gas exhaust section enabled.

11. The method according to claim 8, wherein the central gas exhaust section has an exhaust performance higher than that of the peripheral gas exhaust section.

12. The method according to claim 8, wherein an auxiliary gas exhaust section is connected to the central exhaust port and configured to exhaust gas from inside the transfer chamber, the auxiliary gas exhaust section having an exhaust performance lower than that of the central gas exhaust section.

13. The method according to claim 12, wherein the method further comprises a holding step of holding a vacuum inside the transfer chamber by setting the first gate valve closed and the door valve closed and setting the central gas exhaust section disabled while setting the auxiliary gas exhaust section enabled, and the atmospheric transfer step and the first and second vacuum transfer steps include setting the auxiliary gas exhaust section disabled.

14. A method for using a vacuum processing system, the method comprising:

a first standby step of setting all of first gate valves, respectively positioned between a common transfer chamber and a plurality of process chambers, closed and setting a common gas exhaust section, which is connected to a common exhaust port formed in a bottom of the common transfer chamber, enabled to exhaust gas from inside the common transfer chamber with a target object present therein;

then, a first vacuum transfer step of setting one of the first gate valves open and transferring the target object by a transfer mechanism disposed in the transfer chamber through said one of the first gate valves from the transfer chamber into a corresponding one of the process chambers, with an operation of setting the common gas exhaust section disabled while setting one of individual gas exhaust sections corresponding to said one of the first gate valves enabled in a period of from immediately before opening said one of the first gate valves to immediately after closing said one of the first gate valves, wherein the individual gas exhaust sections are respectively connected to individual exhaust ports formed in the bottom of the common transfer chamber respectively at foots of the first gate valves;

then, a second standby step of setting said one of the first gate valves closed and setting said one of the individual gas exhaust sections disabled while setting the common gas exhaust section enabled to exhaust gas from inside the common transfer chamber, with the target object being processed inside said corresponding one of the process chambers; and then, a second vacuum transfer step of setting said one of the first gate valves open and transferring the target object by the transfer mechanism through said one of the first gate valves from said corresponding one of the process chambers into the transfer chamber, with an operation of setting the common gas exhaust section disabled while setting said one of the individual gas exhaust sections enabled in a period of from immediately before opening said one of the first gate valves to immediately after closing said one of the first gate valves.

15. The method according to claim 14, wherein the first standby step includes setting all of the individual gas exhaust sections disabled.

16. The method according to claim 14, wherein the common gas exhaust section has an exhaust performance higher than that of each of the individual gas exhaust sections.

17. The method according to claim 14, wherein the individual gas exhaust sections and the common gas exhaust section are connected to a common vacuum pump through exhaust passages respectively provided with switching valves, and setting the individual gas exhaust sections and the common gas exhaust section enabled/disabled is performed by opening/closing the switching valves in the method.

18. The method according to claim 14, wherein the first and second standby steps include supplying a purge gas into the common transfer chamber from a gas supply section, which is connected to a gas supply port disposed in the common transfer chamber at a position higher than the transfer mechanism, to set a pressure inside the common transfer chamber higher than that inside the process chambers.

19. The method according to claim 14, wherein a load-lock chamber is connected to the common transfer chamber through a second gate valve, and capable of adjusting an inner pressure thereof between atmospheric pressure and a vacuum, wherein no exhaust port is formed in the bottom of the common transfer chamber at a foot of the second gate valve.

20. The method according to claim 14, wherein each of the individual exhaust ports has a width not smaller than an opening width of a corresponding one of the first gate valves.

* * * * *